(12) United States Patent  
Gomm et al.

(10) Patent No.: US 7,973,577 B2
(45) Date of Patent: *Jul. 5, 2011

(54) CONTROL OF A VARIABLE DELAY LINE USING LINE ENTRY POINT TO MODIFY LINE POWER SUPPLY VOLTAGE

(75) Inventors: Tyler Gomm, Boise, ID (US); Kang Yong Kim, Boise, ID (US); Jongtae Kwak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/432,267

(22) Filed: Apr. 29, 2009

(65) Prior Publication Data

US 2009/0206898 A1 Aug. 20, 2009

Related U.S. Application Data

(63) Continuation of application No. 11/608,903, filed on Dec. 11, 2006, now Pat. No. 7,541,851.

(51) Int. Cl.
*H03L 7/06* (2006.01)
(52) U.S. Cl. ......................... 327/158; 327/149
(58) Field of Classification Search .................. 327/149, 327/158
See application file for complete search history.

(56) References Cited

U.S. PATENT DOCUMENTS

| 6,438,067 B2* | 8/2002 | Kuge et al. | 365/233.14 |
| 6,765,836 B2* | 7/2004 | Menczigar | 365/212 |
| 7,129,800 B2* | 10/2006 | Gauthier et al. | 331/175 |
| 7,471,130 B2 | 12/2008 | Gomm et al. | |
| 2003/0179026 A1* | 9/2003 | Alexander et al. | 327/158 |
| 2007/0018702 A1* | 1/2007 | Lee | 327/158 |
| 2007/0182469 A1* | 8/2007 | Zimlich | 327/158 |

OTHER PUBLICATIONS

S. Kuge et al., "A 0.18-μm 256-Mb DDR SDRAM with Low-Cost Post-Mold Tuning Method for DLL Replica," IEEE J. Solid State Circuits, vol. 35, No. 11, pp. 1680-1689 (2000).

* cited by examiner

*Primary Examiner* — Lincoln Donovan
*Assistant Examiner* — Ryan C Jager
(74) *Attorney, Agent, or Firm* — Wong, Cabello, Lutsch, Rutherford & Brucculeri, LLP

(57) ABSTRACT

Disclosed herein is a VDL/DLL architecture in which the power supply to the VDL, VccVDL, is regulated at least as a function of the entry point of the input signal (ClkIn) into the VDL. Specifically, VccVDL is regulated to be higher when the delay through the VDL is relatively small (when the entry point is toward the right (or minimum delay) edge of the VDL) and is reduced when the delay is relatively high (when the entry point is toward the left (or maximum delay) edge of the VDL). This provides for graduated delays across the stages of the VDL, but without the need to design each stage separately. Other benefits include a VDL/DLL design operable over a wider range of frequencies, and a reduced number of stages, including a reduced number of buffer stages. Moreover, when the disclosed technique is used, buffer stages may be dispensed with altogether. Additionally, the disclosed VDL architecture can be used in any situation where it might be advantageous to delay a signal through a variable delay as a function of VDL entry point.

23 Claims, 13 Drawing Sheets

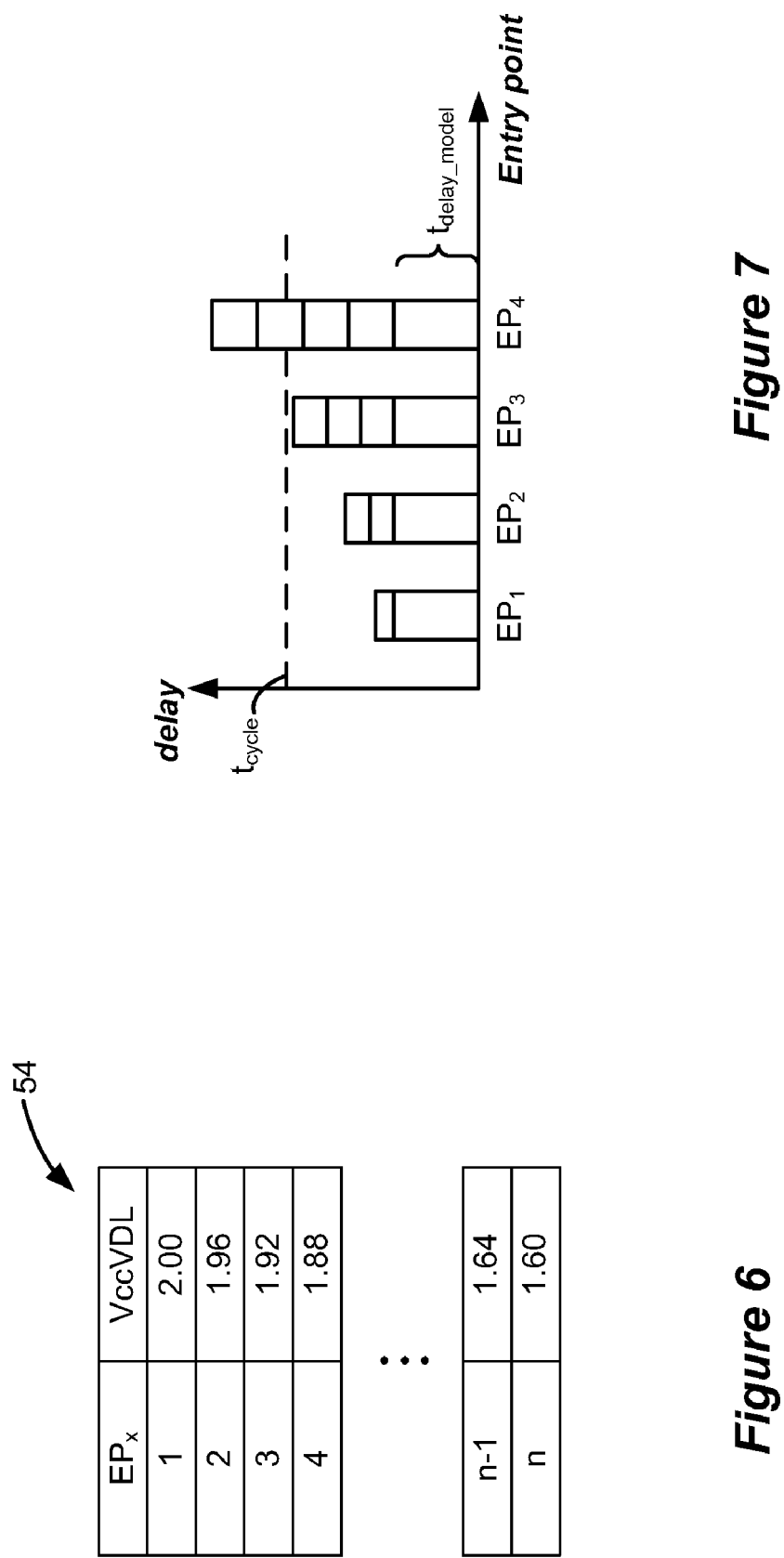

| EPx | VccVDL | delay |
|---|---|---|
| 1 | 2.00 | $t_1$ |
| 2 | 1.96 | $t_2$ |
| 3 | 1.92 | $t_3$ |
| 4 | 1.88 | $t_4$ |
| 5 | 1.84 | $t_5$ |
| 6 | 1.80 | $t_6$ |
| 7 | 1.76 | $t_7$ |
| 8 | 1.72 | $t_8$ |

↑ initial entry point

| EPx | VccVDL |
|---|---|
| 1 | 2.00 |
| 2 | 2.00 |
| 3 | 2.00 |
| 4 | 2.00 |
| 5 | 1.95 |
| 6 | 1.95 |
| 7 | 1.95 |
| 8 | 1.95 |
| 9 | 1.90 |
| 10 | 1.90 |
| 11 | 1.90 |
| 12 | 1.90 |
| 13 | 1.85 |
| 14 | 1.85 |
| 15 | 1.85 |
| 16 | 1.85 |

| EP$_x$ | VccVDL |
|---|---|
| 1 | 2.00 |
| 2 | 1.97 |
| 3 | 1.94 |
| 4 | 1.91 |
| 5 | 1.88 |
| 6 | 1.85 |
| 7 | 1.85 |
| 8 | 1.85 |
| 9 | 1.85 |
| 10 | 1.85 |
| 11 | 1.85 |
| 12 | 1.85 |

*Figure 11*

| EP$_x$ | VccVDL |
|---|---|
| 1 | 2.00 |
| 2 | 2.00 |
| 3 | 2.00 |
| 4 | 2.00 |
| 5 | 1.99 |
| 6 | 1.98 |
| 7 | 1.97 |
| 8 | 1.96 |
| 9 | 1.95 |
| 10 | 1.94 |
| 11 | 1.93 |
| 12 | 1.92 |

*Figure 10*

| $EP_x$ | VccVDL | ΔVccVDL |
|---|---|---|
| 1 | 2.00 | - |
| 2 | 1.99 | 0.01 |
| 3 | 1.98 | 0.01 |
| 4 | 1.97 | 0.01 |
| 5 | 1.96 | 0.01 |
| 6 | 1.92 | 0.04 |
| 7 | 1.88 | 0.04 |
| 8 | 1.84 | 0.04 |
| 9 | 1.80 | 0.04 |
| 10 | 1.76 | 0.04 |
| 11 | 1.74 | 0.02 |
| 12 | 1.72 | 0.02 |
| 13 | 1.70 | 0.02 |
| 14 | 1.68 | 0.02 |

*Figure 13*

| $EP_x$ | VccVDL |
|---|---|
| 1 | 2.00 |
| 2 | 1.99 |
| 3 | 1.98 |
| 4 | 1.97 |
| 5 | 1.96 |
| 6 | 1.95 |
| 7 | 1.95 |
| 8 | 1.95 |
| 9 | 1.95 |
| 10 | 1.95 |
| ... | ... |
| n-6 | 1.95 |
| n-5 | 1.95 |
| n-4 | 1.95 |
| n-3 | 1.94 |
| n-2 | 1.93 |
| n-1 | 1.92 |
| n | 1.91 |

| EPx | VccVDL | ΔVccVDL |
|---|---|---|
| 1 | 2.00 | - |
| 2 | 1.99 | 0.01 |
| 3 | 1.99 | - |
| 4 | 1.99 | - |
| 5 | 1.98 | 0.01 |
| 6 | 1.98 | - |
| 7 | 1.97 | 0.01 |
| 8 | 1.97 | - |
| 9 | 1.96 | 0.01 |
| 10 | 1.94 | 0.02 |
| 11 | 1.91 | 0.03 |
| 12 | 1.85 | 0.06 |

US 7,973,577 B2

CONTROL OF A VARIABLE DELAY LINE USING LINE ENTRY POINT TO MODIFY LINE POWER SUPPLY VOLTAGE

CROSS REFERENCE TO RELATED APPLICATIONS

This application is a continuation of U.S. patent application Ser. No. 11/608,903, filed Dec. 11, 2006, to which priority is claimed, and which is incorporated by reference in its entirety.

FIELD OF THE INVENTION

Embodiments of this invention relate to the controlling the delay of a variable delay line, which is particularly useful when used in a delay locked loop in an integrated circuit.

BACKGROUND

It is often desired in an integrated circuit to delay a signal. In the context of a periodic signal like a clock signal, adjustment of delay can be understood as an adjustment of the phase of the signal. Such phase shifting of a clock signal can be achieved by use of a delay locked loop (DLL), which is commonly used to generate internal clock signals for an integrated circuit from a master external clock signal. Because of the complexity of modern-day integrated circuits, the ability to finely shift the phase of a clock signal is particularly important to ensure proper timing and synchronization within the circuit.

A typical DLL 10 is shown in FIG. 1. As shown, the DLL 10 derives an (internal) output clock signal (ClkOut) (or more than one output clock signal; only one is shown for simplicity) from an (external) input clock signal (ClkIn), in which the phase or delay between the two clocks can be tightly controlled. The DLL 10 comprises a variable delay line (VDL) 12 for providing a variable amount of delay to the input clock signal, and a delay model 14 for providing a fixed delay to the input clock signal. As is known, the delay model 14 models delays outside of the loop, such as those provided by the input buffers, the output buffers, the clock distribution network, etc. (not shown for simplicity). The output of the delay model 14 and the input clock signal, ClkIn, are compared at a phase detector (PD) 16, which essentially determines whether one of these signals is lagging or leading the other, and seeks to bring these two phases into alignment. For example, if the output of the delay model 14 leads ClkIn, then the phase detector 16 outputs an "Up" signal, which increases the delay through the VDL 12. By contrast, if the output of the delay module 14 lags ClkIn, then the phase detector 16 outputs a "Down" signal to decrease the delay through the VDL 12. Through this scheme, the output clock signal, ClkOut, can eventually be locked into a phase relationship with the input clock signal, ClkIn.

One example of a variable delay line (VDL 12) is shown in FIG. 2. As mentioned above, the VDL 12 receives control signals "Up" or "Down" from the phase detector 16 to control the amount of delay that VDL 12 imparts to the input clock signal, ClkIn. In this regard, the exemplary VDL 12 is comprised of a plurality of stages $20_1$ to $20_4$. Four such stages 20 are shown in FIG. 2 for simplicity, but a realistic VDL 12 would normally have a hundred or so stages. Each stage 20 in this example comprises a D flip flop 22 and a few NAND gates 24. The control signals "Up" and "Down" from the phase detector 16 adjust at which stage 20 the ClkIn signal will enter the VDL 12, which in turn defines the delay the VDL 12 imparts. For example, as shown, the "Up"/"Down" control signals have been used to set stage $20_2$ as the entry point for ClkIn. Accordingly, the outputs Q/Q* of flip flop $22_2$ have been set to 1/0, while all other flip flops $22_4$, $22_3$, and $22_1$ have their outputs set to 0/1. As these logic signals percolate through the NAND gates 24 as shown, it can be seen that ClkIn will pass through the NAND gates 24 only in entry stage $20_2$ and all subsequent stages (i.e., $20_1$), and the inherent delays in those NAND gates 24 will function to delay the signal.

Should the phase detector 16 determine that the delay needs adjustment, one of control signals "Up" or "Down" would be asserted. For example, assume from the initial condition in FIG. 2 that an "Up" signal is subsequently asserted, because the phase detector 16 has decided that further delay is warranted in the VDL 12. This would shift the asserted flip flop 22 output Q/Q* of 1/0 to the next stage to the left, i.e., to flip flop $22_3$, with all other flip flop outputs set to 0/1. As a result, the ClkIn signal would now enter the VDL 12 at stage $20_3$, and hence would pass through the NAND gates 24 in stages $20_3$, $20_2$, and $20_1$, thus increasing the delay through the VDL 12. By contrast, a "Down" signal would shift the entry point one stage 20 to the right, decreasing the delay through the VDL 12. In other embodiments, the control signals "Up" and "Down" could be combined for example, and thus only one control signal is necessary to control the VDL 12 in many useful embodiments, although two digital control signals are shown in FIG. 2.

It is typical to provide the circuit elements in the VDL 12 (the flip flops 22, the NAND gates 24, etc.) with a dedicated power supply voltage (VccVDL) which is isolated from the master power supply voltage (Vcc) of the integrated circuit, as is shown in the block diagram of FIG. 1. Providing an isolated power supply to the VDL 12 is beneficial to prevent perturbations in the master power supply Vcc from being seen by the VDL 12 and adversely affecting its delay. Such isolation is important: without isolation, if the VccVDL node becomes higher than normal because of perturbations present on Vcc, delay through the VDL 12 will be quicker than expected, because a higher power supply voltage will cause the circuit elements in the VDL 12 to act more quickly. Conversely, if the VccVDL node becomes lower than normal, the opposite occurs, and delay through the VDL 12 will be slower than expected.

To isolate these two power supplies, and as shown in FIG. 1, VccVDL is generated from the master power supply Vcc using a voltage regulator circuit 15. The details of such a regulator circuit 15 are variant and well known, and hence are not shown for simplicity. While VccVDL is shown as comprising an isolated power supply dedicated only to the VDL circuitry, one skilled in the art will realize that this isolated power supply may be used to power other subcircuits in the integrated circuit as well, depending on the designer's preferences and subject to the noise tolerance of the VDL 12.

One skilled in the art will understand that it is generally desired that the VDL circuitry be as stable and flexible as possible. For example, it is generally not desirable that the delay imposed by the VDL 12 vary with process, voltage, or temperature ("PVT variations"). It is also desirable for design flexibility that the VDL be able to impose a delay over a long time period, as this allows the VDL to be used in integrated circuits having a wide range of clock frequencies. For example, if the VDL 12 can impose a maximum delay t(max) of 10 ns, then such a VDL 12 can be used in devices having a clock frequency of 100 MHz (1/t(max)) or greater. However, at the same time, it is preferred that the delay imposed by the VDL 12 be controllable with a fine resolution.

It has been proposed to control the delay through the VDL through modifying its power supply voltage, VccVDL, as a function of temperature. In U.S. Patent Publication 2007/0182469, which is incorporated herein by reference in its entirety, circuitry is disclosed for sensing the temperature of the integrated circuit proximate to the DLL, and to modify VccVDL accordingly to compensate for any variations the temperature might have on the speed of the delay imposed by the VDL. Thus, if the temperature as sensed is relatively high, suggesting that the VDL would not work as efficiently and hence relatively slowly, VccVDL is increased to increase the speed of the delay through the VDL, thus compensating for the temperature. Likewise, if the temperature as sensed is relatively low, the VccVDL can be decreased accordingly. Of course, this approach merely attempts to remove temperature dependency from the VDL by compensating for temperature-dependently delay using the power supply for the VDL, VccVDL, and does not otherwise disclose means for modifying or controlling the delay over a given operational range of frequencies.

Another approach pertaining more directly to control of the delay of the VDL is disclosed in U.S. Pat. No. 7,471,130, which is incorporated herein by reference in its entirety. In that patent, and as illustrated in FIG. 3, the delays in the stages 20 of the VDL 12 are graduated. Thus, as shown, the stages 20 towards the right of the delay line ($20_1$ through $20_{10}$) impart a minimum delay ($t_1$) to the input clock signal, ClkIn. By contrast, as one moves towards the left, the delay in each stage gradually increases, e.g., to $t_2$ for stages $20_{11}$ and $20_{12}$, to $t_3$ for stage $20_{13}$, and so on until the highest (coarsest) delay $t_n$ is experienced in stages $20_{n-1}$ to $20_n$. As explained in the '130 patent, graduating the delay in the stages in this manner allows the VDL 12 to be used over a wider range of frequencies, such that adjustment in the total delay of the VDL 12 is sensibly finer at higher frequencies (where smaller delays are warranted and hence where the entry point tends towards the right end of the delay line) and coarser at lower frequencies (where longer delays are warranted and hence where the entry point tends toward the left end of the delay line). The technique of the '130 patent allows for a fine resolution and fine timing control but without the need for an excessive number of stages 20, which reduces layout space and power consumption in the VDL. As further explained in the '130 patent, the timing delay $t_x$ in each of the stages 20 can be affected for example by varying the lengths or widths of the transistors in the delay elements (e.g., the NAND gates) in each of the stages. Typical values for the delays in each stage would range from approximately 150 ps for the finest stages ($t_1$) to approximately 500 ps for the coarsest stages ($t_n$).

As also shown in FIG. 3, and as discussed in the '130 patent, it is advisable to have a portion of the VDL 12 (i.e., some number of stages 20) act as a "buffer." The buffer stages essentially allow the delay imparted by the VDL 12 to be lessened from an otherwise normal minimum VDL delay as set by an initial entry point. Thus, during conditions in which the DLL seeks to achieve a lock (e.g., upon initialization of the device; exit from a power down mode, etc.), the phase detector 16 will initially set the default entry point into the VDL at the dividing line between the buffer stages and the normal operating stages. This initial entry point is chosen such that it would normally be expected that the delay will need to be increased to achieve a lock, such that the entry point upon lock would fall in the normal operating stages of the VDL 12. However, because of PVT or other variations, it may be the case that achieving a lock will require that the delay through the VDL be lessened, such that the entry point will need to move to the right and into the buffer stages of the VDL 12. Understanding this illustrates the need for a buffer, because if the initial entry point is set at the far right edge of the VDL, the VDL will not be able to produce a smaller delay should one be warranted.

The need for a buffer is unfortunate, because this requires additional stages, and adds to the already large layout of the VDL, which again usually has one hundred or so stages. Moreover, while the approach of the '130 patent allows for a single DLL design to be used with a wider range of frequencies, that wider range of frequencies can necessitate a need for a larger number of stages in the buffer, which is undesirable and which might mean that a large number of buffer stages would probably never be used in a real application. For example, a device with a clock cycle of X might require a total buffer delay of Y and a resolution of Z, while a device with a clock cycle of 2X would only require a total buffer delay of 0.5Y and a resolution of 0.5Z; meeting the needs of both of these devices requires a total buffer delay of Y with a resolution of 0.5Z, which doubles the amount of buffer stages required. Moreover, the approach of the '130 patent is sensitive to power supply variation, i.e., to variations in VccVDL. In particular, such power supply sensitivity may again require having an undesirable increase in the number of buffer stages to ensure proper operation during a lower VccVDL condition, or when the VDL is used in devices having naturally lower-voltage power supply requirements. Also, the need for buffer stages increases the forward delay in the DLL, which can complicate the circuitry and is generally not preferred.

A further approach to VDL control is disclosed in S. Kuge et al., "A 0.18-µm 256-Mb DDR SDRAM with Low-Cost Post-Mold Tuning Method for DLL Replica," IEEE J. Solid State Circuits, Vol. 35, No. 11, pp. 1680-89 (2000) ("Kuge"), which is briefly summarized in FIGS. 4A to 4C. In Kuge, the VDL 31 is controlled to establish a lock using a coarse adjustment mode followed by a fine adjustment mode. As shown in FIG. 4A, to assist in coarse and fine adjustment, Up/Down counter logic 17 is used to assess the output of the phase detector 16, and to create coarse addressing signals (Ac<0,1>) and fine addressing signals (Af<0,2>). (Kuge discusses further addressing signals, but what is summarized and simplified here is sufficient to describe salient aspects of the operation of his technique). These addressing signals are input to Kuge's VDL 31, which is shown in further detail in FIG. 4B. As shown, the VDL 31 comprises a fine adjustment portion and a coarse adjustment portion, which respectively receive the fine addressing signals Af<0,2> and the coarse addressing signals Ac<0,1>. As shown, the fine addressing signals Af<0,2> can create a fine delay by virtue of adding a capacitance (0, C, 2C, 3C, ... 7C) to the delay line. The coarse addressing signals Ac<0,1> are demultiplexed to produce signals R0 to R3, which set the entry point for the output of the fine adjustment portion, /ClkIn.

Notice as shown in FIG. 4A that the VccVDL regulator 32 receives the Up/Down output from the phase detector 16. This output is used during the coarse adjustment mode to set VccVDL to an optimal level. Specifically, during the coarse adjustment mode, VccVDL is first initialized to a maximum level, and all four coarse stages are used to provide a maximum delay through the coarse adjustment portion, i.e., R0 is high. (None of the fine addressing signals Af<0,2> are asserted during the coarse adjustment mode). Because VccVDL is at a relatively high level, the total delay through the VDL 31 (i.e., through the four coarse stages) is minimized. This initial condition is shown as State 1 of FIG. 4C, which shows the total delay between ClkIn and ClkOut, and thus shows the delay attributable to the delay model 14 ($t_{delay\_model}$) as well as the delay attributable to the four coarse stages ($t_{coarse}$). After this initial condition, VccVDL is incrementally reduced in accordance with the Up/Down control signals from the phase detector 16. As a result of the VccVDL reduction, the delay attributable to the coarse stages is increased as shown in States 2, 3, and 4 of FIG. 4C. The goal of this strategy (of decreasing VccVDL) is to search of an optimal condition in which the total delay exceeds the clock cycle time ($t_{cycle}$) by an appreciable margin. Such optimal condition is shown in State 4. Note that during this coarse adjustment mode, the entry point into the VDL 31 remains unchanged.

After reaching the optimal coarse adjustment condition (e.g., State 4), the fine adjustment mode is entered. During the fine adjustment mode, VccVDL is kept to the same value that was deemed optimal during the last iteration of the coarse adjustment mode (i.e., at State 4). However, the coarse addressing signals are now modified to bring the number of coarse stages under the $t_{cycle}$ limit; as shown this amounts to removing two of the four coarse stages, which occurs through assertion of signal R2. Because VccVDL is not changed during the fine adjustment mode, the delay imparted by the coarse stages ($t_{coarse}$) does not change. However, during the fine adjustment mode, the fine addressing signals Af<0,2> are manipulated to gradually insert fine delays into the VDL (Stages 5, 6, and 7) until a lock condition is met.

Kuge's approach is workable, and in some respects is better than the approach of the '130 patent, particularly as concerns layout of the VDL. As can be appreciated, because VccVDL modification is used in addition to a staged approach to adjust the delay during the coarse adjustment mode, the number of coarse stages used can be small. However, any saving in layout of the VDL achieved by Kuge's technique are offset by the additional control complexity that his technique requires. Specifically, his "two mode" approach is difficult to encode in silicon, and such encoding takes up space in its own right. Moreover, switching from one mode to another can create instabilities during the lock process. Simply put, Kuge's approach is difficult to implement and has the potential to suffer from reliability problems.

The art would be benefited by an improved VDL and DLL architecture, and this disclosure provides such a solution.

BRIEF DESCRIPTION OF THE DRAWINGS

Embodiments of the invention will be best understood with reference to the following detailed description, when read in conjunction with the accompanying drawings, in which:

FIG. 6 illustrates how the voltage regulator of the embodiment of FIG. 5 modifies VccVDL as a function of entry point.

FIG. 7 illustrates graphically the total delay through the VDL as a function of entry point in accordance with the embodiment of FIG. 5.

FIGS. 8-14 shows various manners by which the regulator of FIG. 5 may vary the VccVDL as a function of entry point in accordance with embodiments of the invention.

DETAILED DESCRIPTION

Disclosed herein is a VDL/DLL architecture in which the power supply to the VDL, VccVDL, is regulated at least as a function of the entry point of the input signal (ClkIn) into the VDL. Specifically, VccVDL is regulated to be higher when the delay through the VDL is relatively small (i.e., when the entry point is towards the right (or minimum delay) edge of the VDL) and is reduced when the delay is relatively high (i.e., when the entry point is towards the left (or maximum delay) edge of the VDL). This approach achieves the benefits of previous approaches by providing for graduated delays across the stages of the VDL, but without the need to design each stage separately. Such benefits include a VDL/DLL design operable over a wider range of frequencies, and a reduced number of stages, including a reduced number of buffer stages. Moreover, when the disclosed technique is used, buffer stages may be dispensed with altogether. Additionally, while particularly useful in the context of a DLL, it will be recognized that the disclosed VDL architecture can be used in any situation where it might be advantageous to delay a signal through a variable delay as a function of VDL entry point.

Figure 1:
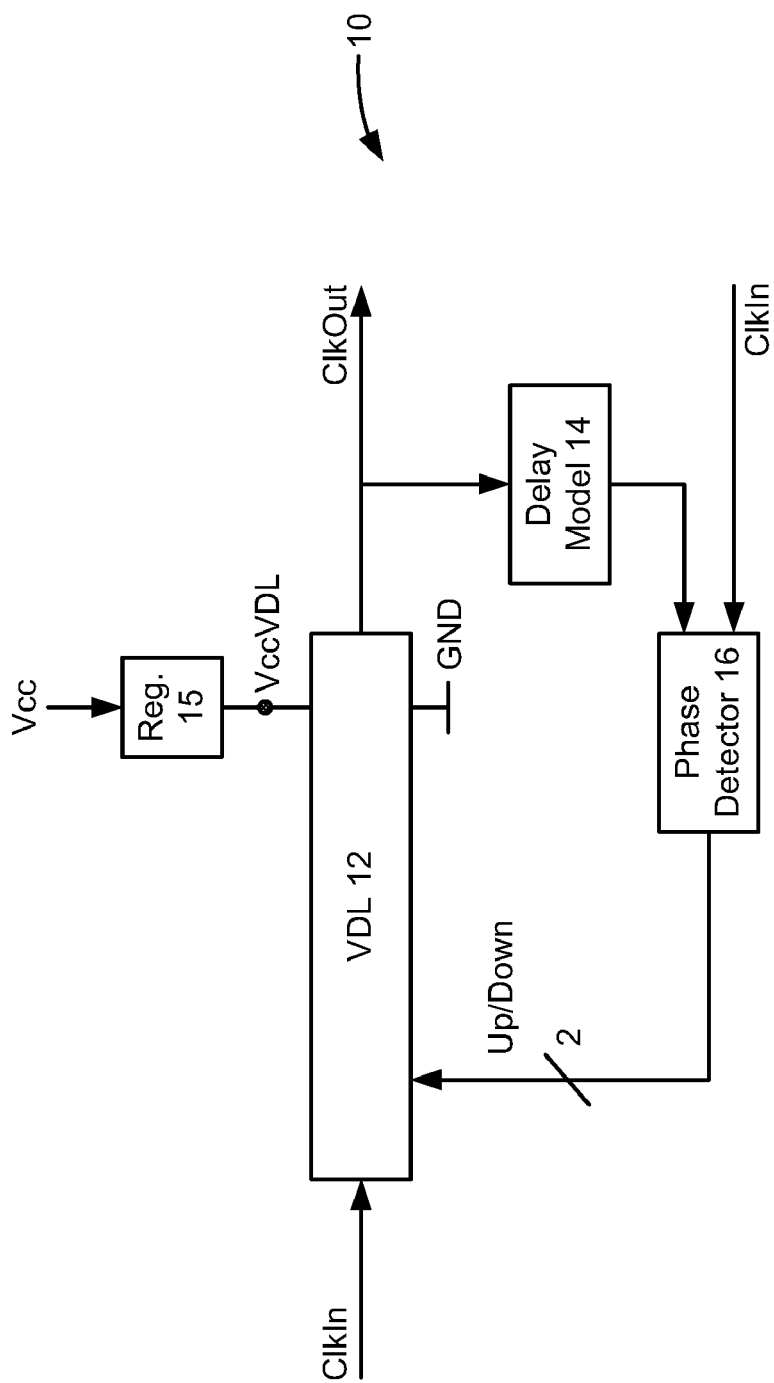
FIG. 1 illustrates a prior art delay locked loop (DLL) and the use of a variable delay line (VDL) within the DLL.
Figure 2:
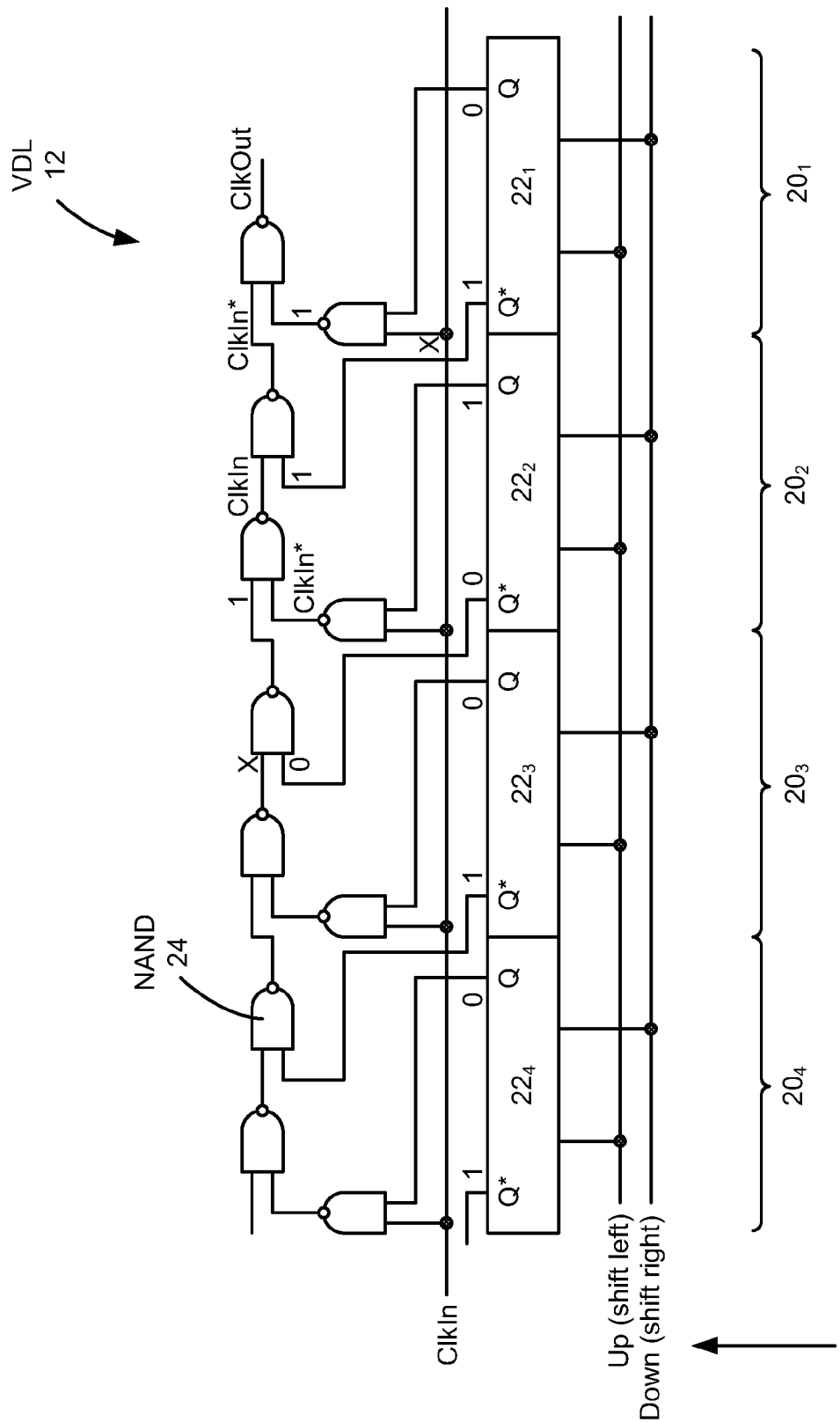
FIG. 2 illustrates the VDL of FIG. 1 in further detail.
Figure 5:
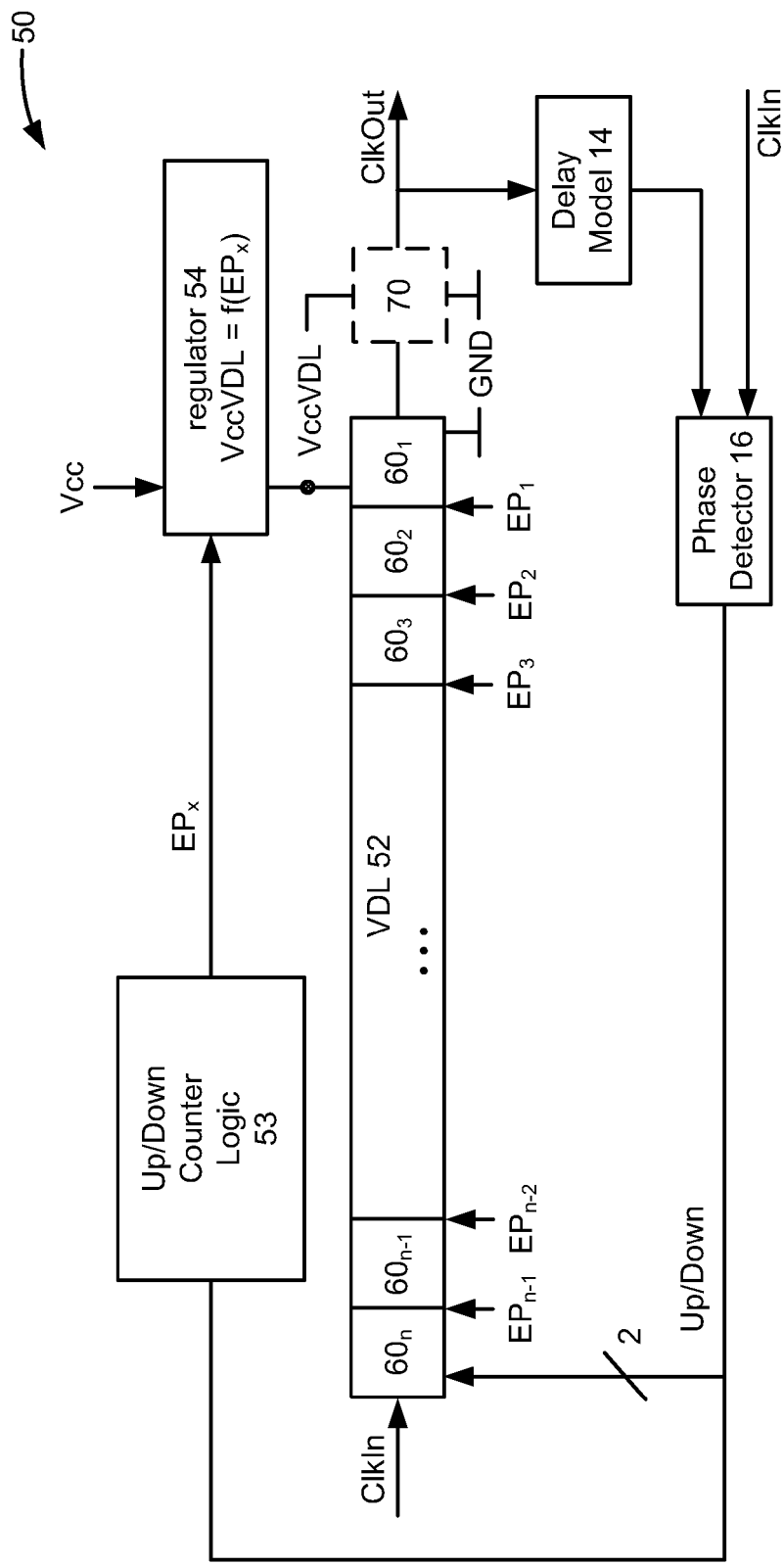
FIG. 5 illustrates an improved VDL and DLL architecture in accordance with an embodiment of the invention in which the delay through the VDL is modified by altering the VDL's power supply voltage, VccVDL, as a function of the entry point into the VDL.

An embodiment of the improved VDL/DLL architecture 50 is shown in FIG. 5. The VDL 52 is comprised of a number of stages $60_x$, and as with the VDLs discussed in the Background section receives Up/Down control signal(s) from the phase detector 16 to modify the entry point (EP) of the input clock (ClkIn) into the VDL. In this respect, the VDL 52 is similar to and/or can comprise the VDLs shown in FIGS. 2 and 3, and each of the stages 60 can be similarly formed.

However, in contradistinction to the VDLs/DLLs discussed in the Background, in the new architecture of FIG. 5, the regulator 54 is modified to receive a control signal that indicates the current entry point, $EP_x$, into the VDL 52. This current entry point can easily be determined by Up/Down counter logic 53, which can count the Up or Down signals generated by the phase detector to keep track of the absolute position of the entry point.

The entry point signal $EP_x$, as generated by the Up/Down Counter Logic 53, can comprise any number of formats. For example, and preferably, $EP_x$ can comprise a digital bus having enough signals to indicate each entry point position ($EP_1$, $EP_2$, $EP_3$, etc.) in the VDL 52. (For example, if the VDL 52 has 64 stages, then the entry point signal $EP_x$ can comprise a bus with six lines, i.e., $2^6=64$). Alternatively, $EP_x$ can comprise an analog signal reflective of the current entry point.

Regardless, $EP_x$ is received at the regulator 54 and is used to set the level of VccVDL. In a preferred embodiment, VccVDL varies inversely with $EP_x$, as reflected in the table of FIG. 6, which functionally shows the operation of the regulator 54. Thus, as shown, earlier entry points (those towards the right of the VDL 52) dictate a higher VDL power supply voltage, VccVDL, while later entry points (towards the left of the VDL) dictate a lower VccVDL. This effect can be seen in FIG. 7, which illustrates the total delay between ClkIn and ClkOut. (FIG. 7 in this respect is somewhat similar to FIG.

4C, except that FIG. 7's X-axis reflects the entry point as opposed to the State or time). As shown in FIG. 7, when the entry point is at $EP_1$, only one stage worth of delay is seen (in addition to the delay imposed by the delay model); at $EP_2$, two stages of delay are present, but because VccVDL is slightly lower, each of these two delays are larger than the first delay; at $EP_3$, three stages of delay are present, with each being larger than the second delays, etc.

The result is that the delays in the stages of the VDL 52 are graduated, similar to the manner in which the VDL of the previously-discussed '130 patent (FIG. 3) is graduated. However, the delays in the stages of the '130 patent are graduated by virtue of physical differences in the stages as they are fabricated (e.g., using transistors of different widths or lengths), while the delays in the stages of VDL 52 of FIG. 5 are graduated by virtue of the reduction of VccVDL. This means, advantageously, that the stages 60 in the VDL 52 of FIG. 6 can be made identically, i.e., with transistors of the same widths and lengths, which simplifies the design. Another advantage to using a control voltage rather than the physical transistor properties to set the graduation is that the graduation amount and graduation profile may be altered after production, unlike the approach of the '130 patent. This can be important because some designs may not need graduation at all, whereas other designs might want or need an altered delay profile. Such modification to the graduation can occur through the use of fuses, anti-fuses, non-volatile programmable elements, or other known methods for adjusting or tuning a circuit post production.

Otherwise, the improved VDL/DLL architecture 50 provides similar benefits to those discussed above with respect to the '130 patent, including a lesser number of stages 60 in the VDL, and a resolution that sensibly scales with the total delay and frequency of the clock signal being processed. At higher clock frequencies, where delays through the VDL 52 should be smaller, the timing resolution between the stages 60 is smaller, because the entry point $EP_x$ will be towards the right edge of the VDL 52; at lower clock frequencies, where delays through the VDL can be larger, the timing resolution is less critical and is accordingly longer, because the entry point $EP_x$ will be towards the left edge of the VDL. As a result, one VDL design becomes useable over a wider range of operating frequencies.

The extent and smoothness of the graduation of the delay between the stages can be varied, and can allow for some granularity. For example, FIG. 8 illustrates one embodiment in which VccVDL is decreased in a step wise fashion, such that some entry points $EP_x$ (e.g., EP1-EP4) share the same delay (i.e., the same VccVDL). However, because the VccVDL generally scales with entry point, even without a unique one-to-one correspondence, the result is still a VDL with a generally graduated delay between the stages.

Figure 4A:
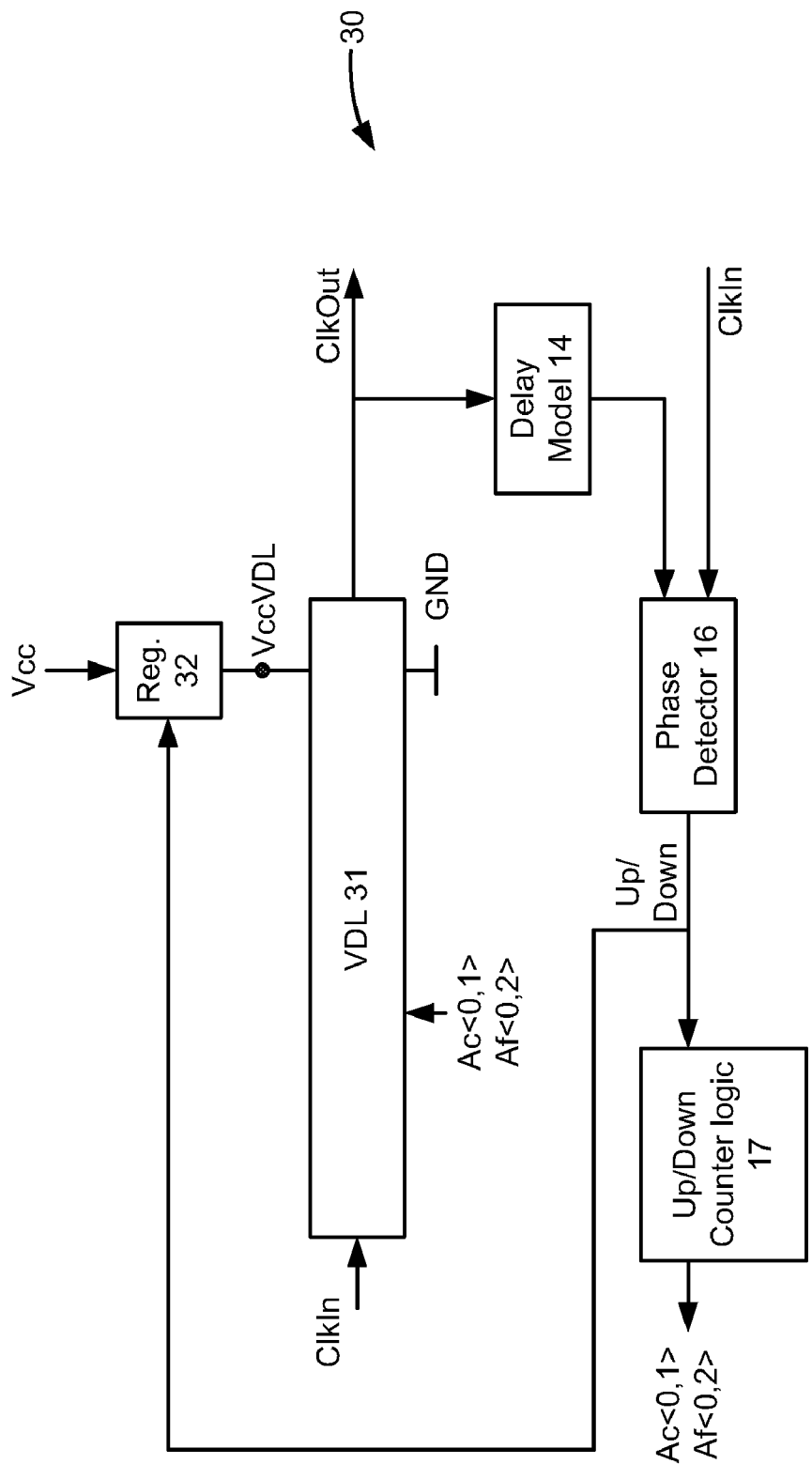
FIGS. 4A to 4C illustrate the VDL and DLL architecture of S. Kuge et al., "A 0.18-μm 256-Mb DDR SDRAM with Low-Cost Post-Mold Tuning Method for DLL Replica," IEEE J. Solid State Circuits, Vol. 35, No. 11, pp. 1680-89 (2000) ("Kuge").
Figure 4B:
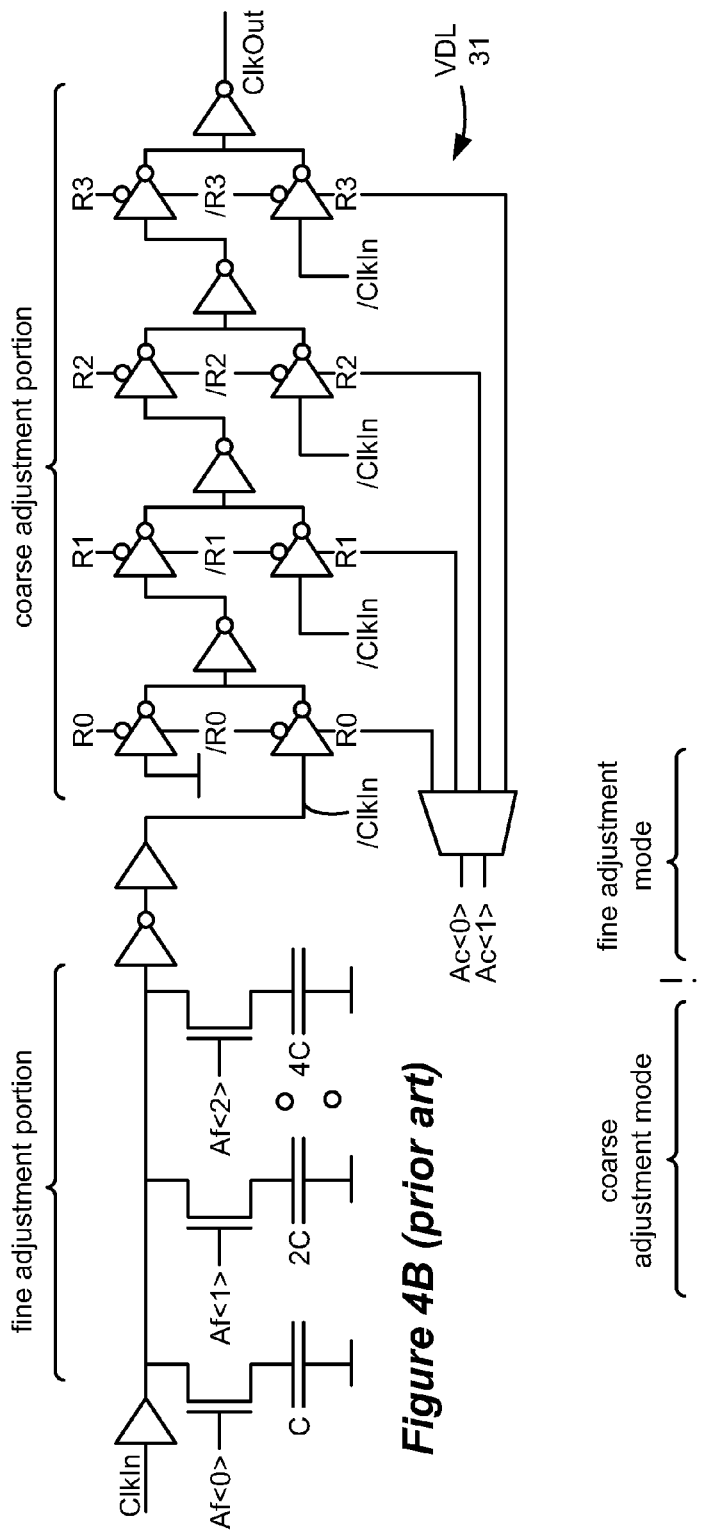
Figure 4C:
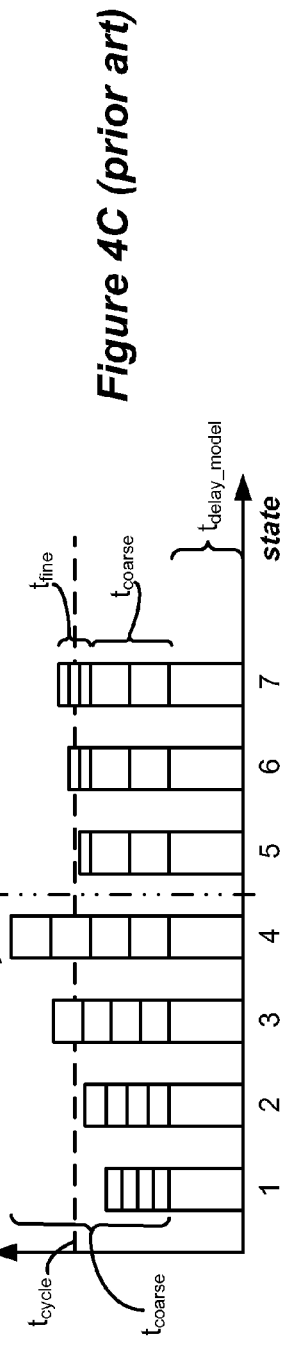

It bears noting that the technique discussed in the Kuge reference is different from that proposed here. As discussed earlier, Kuge does teach that the VDL power supply, VccVDL, can be modified to affect the delay through the VDL, and in particular Kuge illustrates this during the coarse adjustment mode (i.e., the first mode) of his technique (see FIG. 4C, States 1-4). However, Kuge does not disclose or suggest using information concerning the VDL's entry point to determine the magnitude of VccVDL. This should be clear from the fact that Kuge explicitly keeps the number of stages constant during his coarse adjustment mode (e.g., four stages as shown in FIG. 4C) while varying VccVDL. In other words, Kuge discloses modification of VccVDL but only when the entry point is not moving (i.e., is set at R0). Unlike the current technique, the delay of the stages is independent of the entry point.

Figure 3:
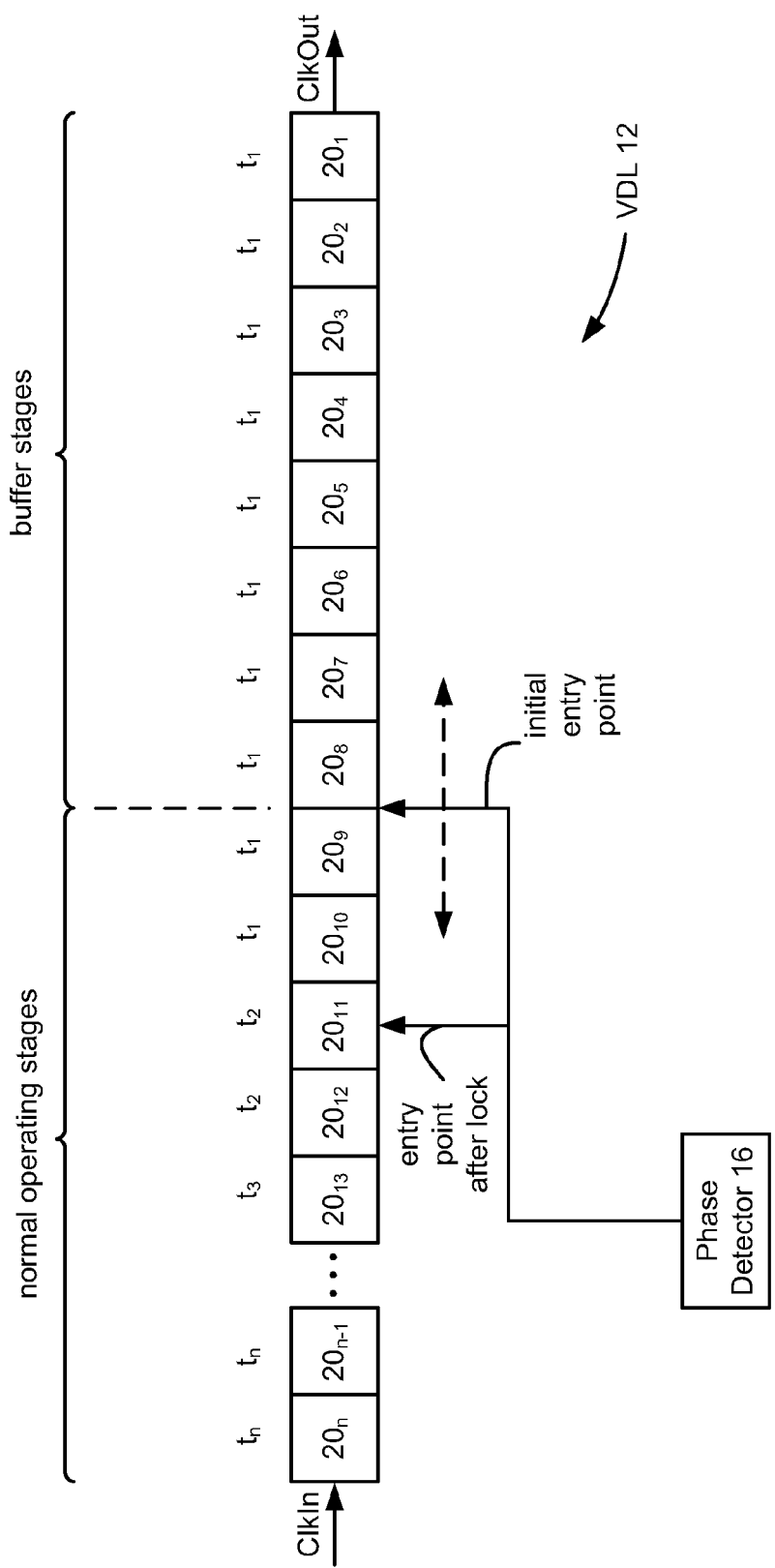
FIG. 3 illustrates the VDL disclosed in U.S. Pat. No. 7,471,130.

Another benefit resulting from graduating the delay by using the entry point $EP_x$ to modify VccVDL is reduction in number or elimination of buffer stages, such as was discussed earlier in conjunction with the '130 patent. As shown in FIG. 3, buffer stages have been essential in other approaches to provide flexibility in case the total delay through the VDL needed to be shortened. In contrast, when the delay is graduated in accordance with embodiments of the disclosed technique, fewer buffer stages are needed. For example, in FIG. 9, assume that an initial entry point into the VDL 52 of $EP_4$ is used, meaning that the initial condition provides delay through four buffer stages $60_1$ to $60_4$ (see FIG. 5). Here, the smallest resolution is experienced in the first stage $60_1$, which delay comprises $t_1$. For a hypothetical non-graduated VDL to provide this same degree of resolution, all of the buffer stages would need to have this same delay $t_1$. But because the total initial delay should be the same for both the graduated and non-graduated examples, the total delay in the hypothetical non-graduated VDL would need to equal $4t_4$ for the graduated VDL shown in FIG. 9. Because $t_1 < t_2 < t_3 < t_4$ in the graduated line, a comparable non-graduated VDL would need to have more than four buffer stages to achieve the same total delay with a comparable minimum resolution of $t_1$.

It should be noted that embodiments of the technique do not require a VccVDL-induced graduated delay across all of the stages of the VDL 52. For example, and as shown in FIG. 10, the first few, smallest delay stages (1-4) are ungraduated, while the remaining stages are graduated in accordance with the disclosed technique. FIG. 11 shows the opposite, in which the first few, smallest delay stages (1-8) are graduated, while the remaining stages are ungraduated. FIG. 12 depicts a blend of the approaches of FIGS. 10 and 11 where graduation happens at the stages on either end, but is ungraduated in the middle stages. FIGS. 13 and 14 shows that the rate of change of VccVDL need not be linear, nor follow any particular trend. In any of these embodiments, an initial entry point with buffer stages could be used anywhere along the continuum of VDL stages.

FIG. 8 through 13 illustrate the operation of the regulator 54 in terms of example VccVDL values. One of ordinary skill will realize that these VccVDL values correspond to particular time delays through each of the stages, but that the relationship between VccVDL and time delay per stage will likely not scale linearly.

As alluded to above, the disclosed technique can dispense with the need to have buffer stages altogether, or at a minimum can allow for the delay through the VDL 52 to continue to be reduced even when no further stages are available to further reduce the delay (i.e., when the entry point is set at $EP_1$). This is because a VDL 52 such as that illustrated in FIG. 5 will have inherent delays which are affected by VccVDL, but which are independent of entry point. For example, even when the entry point equals $EP_1$, ClkIn must still travel through the last stage $60_1$ (see also stage $20_1$ in FIG. 2), and furthermore will likely encounter some type of conditioning circuitry 70 on the output of the VDL 52, as shown in dotted lines in FIG. 5. Such conditioning circuitry 70 can include output drivers, duty cycle trimming circuitry, level translators, and are logically powered by the VDL's power supply, VccVDL. Therefore, the delay inherent in such circuitry (stage $60_1$; conditioning circuitry 70) can be controlled by VccVDL to even further reduce the delay line delay.

Figure 15:
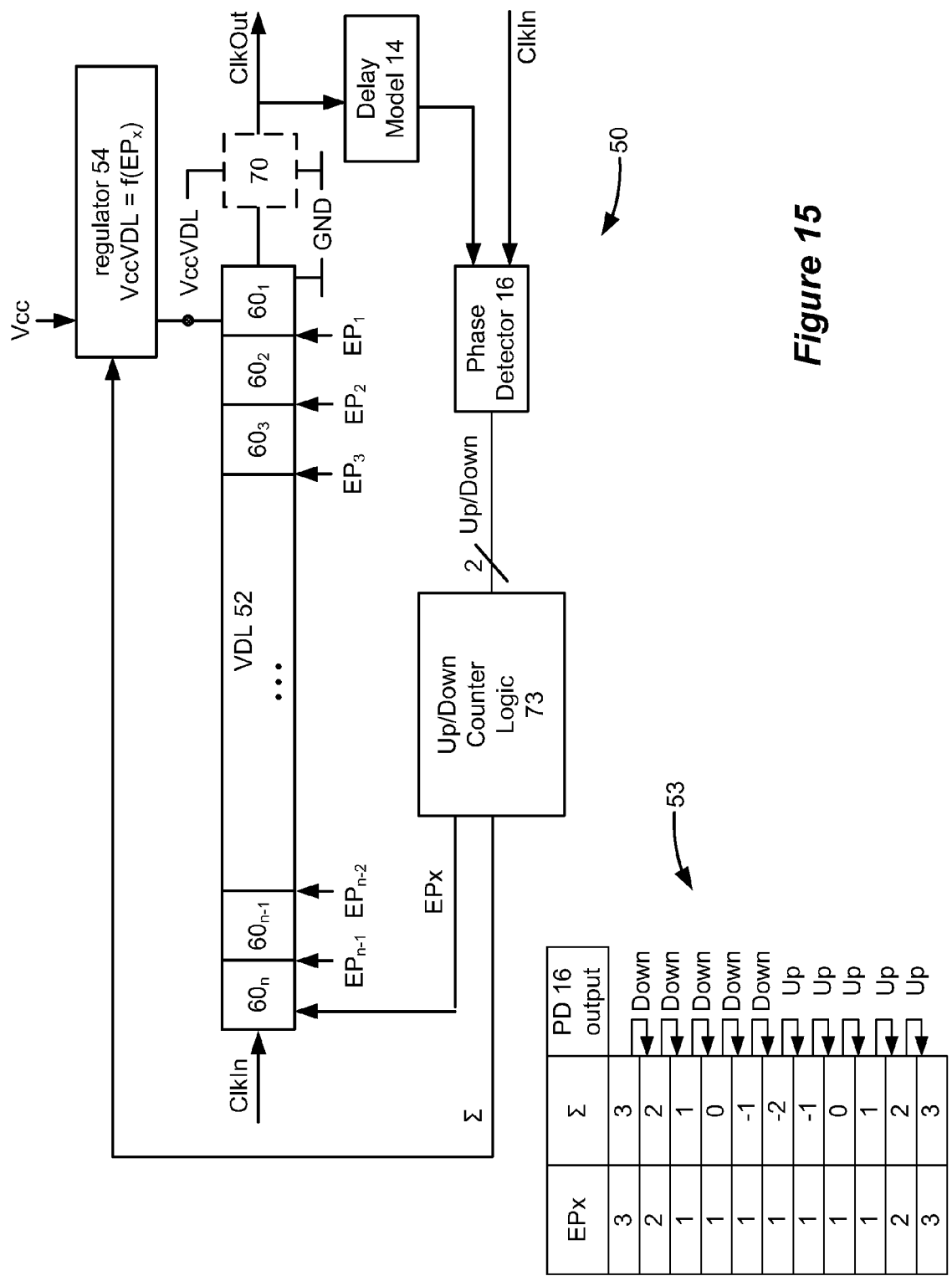
FIG. 15 illustrates another embodiment of the invention which additionally has the capability to further reduce the delay through the VDL once the minimum number of stages has been reached.

FIG. 15 illustrates such an embodiment. In this embodiment, it is beneficial to provide two separate outputs from the Up/Down counter logic 73: the entry point signal $EP_x$ that is input to the VDL 52; and a true Up/Down summed signal $\Sigma$ that allows non-positive integers to be sent to the regulator 54. An illustration of the functionality of the Up/Down counter logic 73 is shown in the table in FIG. 15. As shown, the entry point signal $EP_x$, as before, is limited to positive integer values, which preserves the reality that ClkIn must enter the VDL 52 through at least the last stage ($EP_1$). In this regard, the Up/Down counter logic 73 is no different from Up/Down counter logic 53 as explained in earlier embodiments. However, when this last-stage limit is reached, the summed signal $\Sigma$, which had otherwise tracked $EP_x$ while positive, can drop to zero and negative values upon further assertion of a Down signal from the phase detector 16. In this circumstance, the regulator 54 still continues to increase VccVDL by a prescribed amount, even though the last stage has been reached. As explained above, this will speed up the inherent circuitry in the last stage $60_1$ and in the conditioning circuitry 70 to reduce the delay through the VDL 52. When Up signals are eventually received, the entry point signal $EP_x$ will once again being to track the summed signal $\Sigma$ once it becomes positive, and the entry point $EP_x$ can once again begin shifting to the left to add additional stages 60 into the VDL delay. One skilled in the art will realize that there are many ways of building a suitable Up/Down counter logic 73 based on the functional description provided herein, and that it is not difficult to modify pre-existing Up/Down Counter logic modules (such as logic 53 explained earlier) to provide the additional summed signal $\Sigma$ output.

While the embodiment of FIG. 15 can decrease delay through the VDL 52 even when no further stages 60 are remaining (i.e., when at $EP_1$), it should also be recognized that this embodiment can also be used with buffer stages if desired. For example, the first four stages ($60_1$ through $60_4$) could comprise buffer stages, such that when the circuitry in initialized, the entry point is set at $EP_4$. If smaller delays are required, the entry point can march to the right through the buffer stages in the VDL 52, to $EP_1$. Thereafter, should an even smaller delay be called for, VccVDL can be further increased as described above to even further reduce the delay.

Regardless of whether the regulator 54 receives the entry point signal $EP_x$ (FIG. 5) or the summed signal $\Sigma$ (FIG. 15), it is a simple matter for the regulator 54 to scale the VDL power supply voltage, VccVDL, as a function of that input signal. For example, if the entry point signal comprises a digital bus with a plurality of signals, the regulator 54 can in effect comprise a Digital-to-Analog (D-to-A) converter with appropriate master power supply (Vcc) isolation. Because VccVDL may need to be optimized for a given device because of processing variations or other design preferences, the regulator 54 can be trimable with resistors, fuses, antifuses, etc., as one skilled in the art will readily understand.

Figure 16:
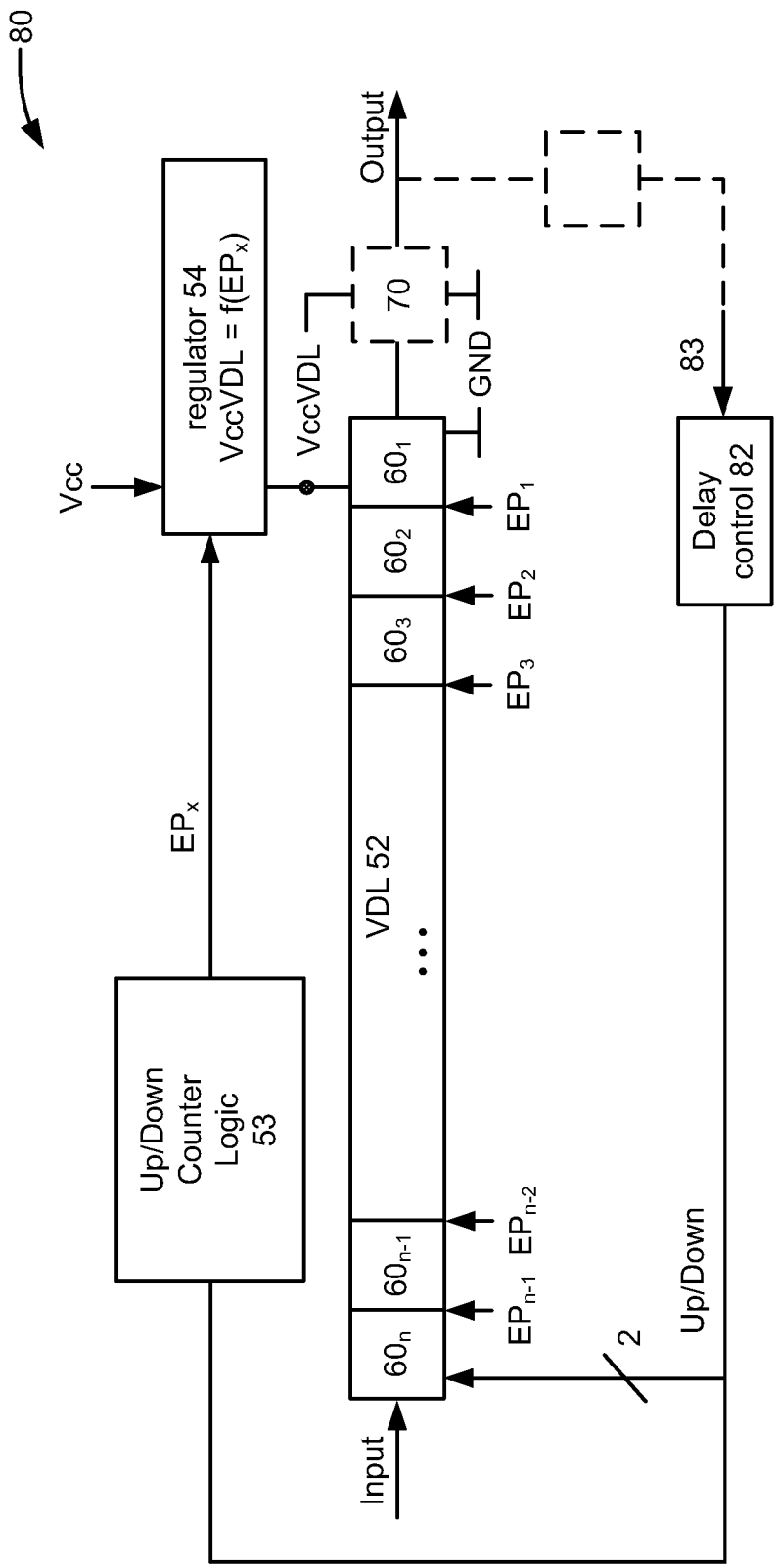
FIG. 16 illustrates the operation of the Up/Down counter logic of FIG. 15.

While particularly useful in the context of a DLL, it will be recognized that the disclosed VDL architecture can be used in any situation where it might be advantageous to delay a signal through a variable delay as a function of VDL entry point. This is shown in FIG. 16, which represents a generic delay element 80 useable in any context in an integrated circuit. As shown, the Output comprises a delayed version of the Input, which need not be a periodic clock signal as in the DLL embodiments described earlier. As shown, some logic (depending on the environment at hand) in the integrated circuit is used to adjust the delay through the delay element 80, and which is shown generically in FIG. 16 as delay control circuitry 82. The input 83 to such control circuitry 82 can comprise any sort of signal (such as from a microcontroller), and may or may not be derived based on feedback from the Output signal (such feedback being shown optionally in dotted lines).

In any event, the delay control circuitry 82, like the phase detectors 16 of the DLL embodiments, outputs an Up/Down signal which generates an entry point signal $EP_x$ dictating at which stage $60x$ the Input signal will enter the VDL 52. As was also illustrated in the DLL embodiments, Up/Down counter logic 53 tracks the entry point to produce an entry point signal $EP_x$ which is sent to the regulator 54. As before, the regulator 54 scales the VDL power supply, VccVDL, in accordance with the entry point signal, $EP_x$.

As used herein, a "delay" comprises an output signal either leading or lagging an input signal. Thus, in the disclosed DLL, although technically the output clock is said to lead the input clock, it should be understood due to the cyclical nature of clock signals that such leading can also be interpreted as lagging, and hence comprises a "delay" in the output clock signal.

While embodiments of the invention have been disclosed, it should be understood that the disclosed circuitry can be achieved in many different ways to the same useful ends as described herein. In short, it should be understood that the inventive concepts disclosed herein are capable of many modifications. To the extent such modifications fall within the scope of the appended claims and their equivalents, they are intended to be covered by this patent.

What is claimed is:

1. A delay locked loop for an integrated circuit, comprising:
   a variable delay line comprising a plurality of stages for receiving a first clock and for producing a second clock delayed with respect to the first clock, wherein the delay between the first clock and the second clock is variable by adjusting a number of stages that the first clock passes through; and
   a regulator for providing a power supply voltage for the variable delay line, wherein the regulator receives data indicative of the variable delay and regulates the power supply voltage as a function of the number of stages that the first clock passes through.

2. The delay locked loop of claim 1, wherein the data indicative of the variable delay is carried on a digital bus.

3. The delay locked loop of claim 1, wherein the regulator provides the power supply voltage for the variable delay line by deriving it from a first voltage.

4. The delay locked loop of claim 3, wherein the first voltage comprises a master power supply voltage for the integrated circuit.

5. The delay locked loop of claim 1, further comprising:
   a delay model for delaying the second clock; and
   a phase detector for receiving the output of the delay model and the first clock, and for outputting at least one control signal for controlling the variable delay,
   wherein the data indicative of the variable delay is derived from the at least one control signal.

6. The delay locked loop of claim 5, further comprising counter logic for receiving the at least one control signal and for deriving the data indicative of the variable delay.

7. The delay locked loop of claim 1, wherein the regulator regulates the power supply voltage in inverse proportion to the variable delay.

8. A delay locked loop for an integrated circuit, comprising:
   a variable delay line for receiving a first clock and for producing a second clock delayed with respect to the first clock, wherein the variable delay line comprises a plurality of delay stages, wherein the variable delay line receives at least one control signal to increase or decrease the number of delay stages through which the first clock must pass to respectively lengthen or shorten first clock delay through the variable delay line; and circuitry for providing a power supply voltage for the variable delay line, wherein the circuitry decreases the power supply voltage when the number of stages is increased, and increases the power supply when the number of stages is decreased.

9. The delay locked loop of claim 8, wherein the circuitry comprises a voltage regulator.

10. The delay locked loop of claim 9, wherein the voltage regulator provides the power supply voltage for the variable delay line by deriving it from a first voltage.

11. The delay locked loop of claim 8, further comprising:
a delay model for delaying the second clock; and
a phase detector for receiving the output of the delay model and the first clock, and for outputting the at least one control signal.

12. The delay locked loop of claim 8, further comprising logic for receiving the at least one control signal and for providing data to the circuitry indicative of the number of stages through which the first clock must pass.

13. The delay locked loop of claim 8, wherein the variable delay line does not comprise buffer stages.

14. Delay circuitry for an integrated circuit, comprising:
a variable delay line comprising a plurality of stages for receiving a first signal and for producing a second signal delayed with respect to the first signal, wherein the delay between the first signal and second signal is variable by adjusting a number of stages that the first clock passes through; and
a regulator for providing a power supply voltage for the variable delay line, wherein the regulator receives data indicative of the variable delay and regulates the power supply voltage as a function of the number of stages that the first clock passes through.

15. The delay circuitry of claim 14, wherein the data indicative of the variable delay is carried on a digital bus.

16. The delay circuitry of claim 14, wherein the regulator provides the power supply voltage for the variable delay line by deriving it from a first voltage.

17. The delay circuitry of claim 16, wherein the first voltage comprises a master power supply voltage for the integrated circuit.

18. The delay circuitry of claim 14, wherein the regulator regulates the power supply voltage in inverse proportion to the variable delay.

19. Delay circuitry for an integrated circuit, comprising:
a variable delay line for receiving a first signal and for producing a second signal delayed with respect to the first signal, wherein the variable delay line comprises a plurality of delay stages, wherein the variable delay line receives at least one control signal to increase or decrease the number of delay stages through which the first signal must pass to respectively lengthen or shorten first signal delay through the variable delay line; and
circuitry for providing a power supply voltage for the variable delay line, wherein the circuitry decreases the power supply voltage when the number of stages is increased, and increases the power supply when the number of stages is decreased.

20. The delay circuitry of claim 19, wherein the circuitry comprises a voltage regulator.

21. The delay circuitry of claim 20, wherein the voltage regulator provides the power supply voltage for the variable delay line by deriving it from a first voltage.

22. The delay circuitry of claim 21, wherein the first voltage comprises a master power supply voltage for the integrated circuit.

23. The delay circuitry of claim 19, wherein one of the stages comprises an initial entry point separating buffer stages in the variable delay line from other delay stages in the variable delay line.

* * * * *